United States Patent [19]
Mizukoshi

[11] Patent Number: 5,389,887
[45] Date of Patent: Feb. 14, 1995

[54] BINARY CODING CIRCUIT

[75] Inventor: Seiichi Mizukoshi, Chigasaki, Japan

[73] Assignee: Eastman Kodak Company, Rochester, N.Y.

[21] Appl. No.: 47,890

[22] Filed: Apr. 19, 1993

[30] Foreign Application Priority Data

Aug. 18, 1992 [JP] Japan .................. 4-219061

[51] Int. Cl.⁶ ............................ H03K 5/00
[52] U.S. Cl. ................ 327/72; 358/465; 327/553
[58] Field of Search ............ 307/520, 268; 328/167; 358/463, 464, 465, 466, 467; 382/50

[56] References Cited

FOREIGN PATENT DOCUMENTS

| 7929719 | 8/1979 | France | 358/466 |
| 0140023 | 8/1982 | Japan | 307/268 |
| 0168385 | 10/1983 | Japan | 358/365 |

Primary Examiner—William L. Sikes
Assistant Examiner—James A. Dudek

[57] ABSTRACT

A binary coding circuit that enables a clear image to be obtained by removing noise elements while retaining the target character and image information, improves image compression efficiency, reliably binarizes low-contrast characters and images and minimizes information loss, thereby providing clearer and more accurate binarized images of character and image information.

1 Claim, 2 Drawing Sheets

BINARY CODING CIRCUIT

BACKGROUND OF THE INVENTION

1. Field of the Invention

The present invention relates to a binary coding circuit for use in copying machines, scanners, printers, image display devices and other such equipment requiring the ability to binarize text and images clearly.

2. Description of the Prior Art

In a conventional a binary coding circuit the signal input to the circuit is passed through a low-pass filter and is then given a prescribed offset value to form a threshold signal, and binarization is carried out by comparing the threshold signal with the original signal. FIG. 3 (a) shows a conventional adaptive binarization processing waveform. In the figure the solid line indicates the input signal A, shown as a voltage corresponding to the brightness level of the signal. The dashed line represents the threshold signal B. Input signal A has a somewhat flat waveform owing to the fact that high-frequency components have been cut. When the input signal is near the black level an offset δ is applied to the white side, and when the input signal is near the white level the offset δ is applied to the black side.

Threshold signal B and input signal A are compared and if input signal A is larger than threshold signal B it is binarized to white, and if it is smaller it is binarized to black.

In this type of conventional binary coding circuit, basically background spatial frequencies are treated as low-frequency components and, as shown by FIG. 3 (a), the usual practice is to binarize the input signal by using a threshold value obtained by adding some offset value to the low-frequency components. In such cases, if the offset value is too small background noise components caused by nonuniformities in the paper surface, in the case of a document scanner, for example, will appear on the binarized image, degrading the clarity of the image. When this results in a high number of noise spots, it results in a marked degradation of the efficiency with which the image data can be compressed, thereby reducing the effectiveness of the compression. On the other hand, if the offset value is too large low contrast characters and images will not be binarized.

SUMMARY OF THE INVENTION

The object of the present invention is therefore to provide a binary coding circuit that improves image compression efficiency by providing better image clarity through the elimination of noise spots and minimizes information loss from non-binarization of low contrast characters and images, thereby providing binarized images that are clearer and more accurate.

In accordance with the present invention the above object is attained by a binary coding circuit that eliminates input signal components that have high frequencies and a small amplitude, comprising an adaptive threshold value generating circuit for generating optimum threshold values for binarization of background components, a high-pass filter circuit that outputs high-frequency components of an input signal, an adder that adds the outputs of the two circuits, and a binarization means that binarizes the input signal on the basis of a comparison of the signal output by the adder and the input signal.

With the binary coding circuit thus arranged in accordance with the present invention, a threshold value is generated by a binary coding circuit that generates a threshold value optimized for binarization purposes with respect to the background brightness, this threshold value is added by an adder to the output of a processing circuit that includes a high-pass filter, the signal that is output by the adder is compared with the input signal, and the input signal is binarized based on this comparison. Accordingly at noise portions there is no intersection of threshold values and noise components so the noise does not get binarized. Also, characters or fine image components that have a large amplitude, or which have a small amplitude but are thick, are determined as being characters and are therefore retained, which by thus minimizing the amount of information that is lost results in clear binarized images.

Further features of the invention, its nature and various advantages will become more apparent from the accompanying drawings and following detailed description of the invention.

DESCRIPTION OF THE PREFERRED EMBODIMENT

Figure 1:
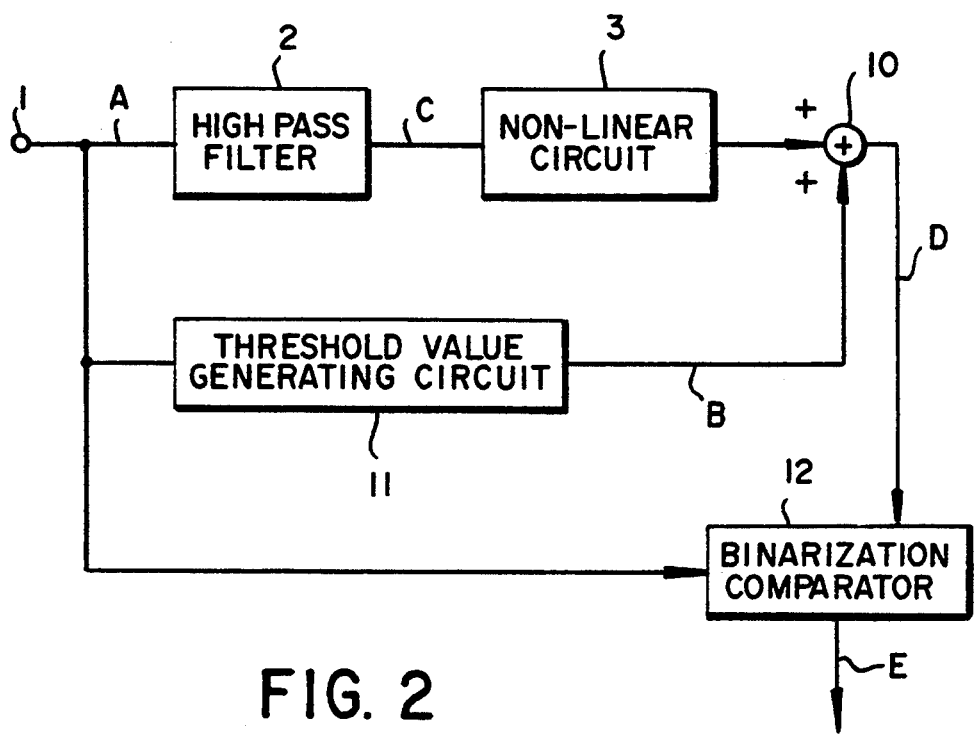
FIG. 1 is a block diagram of the binary coding circuit according to a first embodiment of the present invention.

FIG. 1 is a block diagram of a first embodiment of the present invention. With reference to FIG. 1, a signal input via an input terminal 1 is divided into two signals. One of these signals goes to an adder 10 via a high-pass filter 2 and a limiter or other such non-linear circuit 13. The other signal goes to the adder 10 via a conventional adaptive threshold value generating circuit 11, and after being added to the output of the non-linear circuit 3 is input to a binarization comparator 12 that forms the binarizing means, where it is compared with the signal directly input via the input terminal 1 and the product is output as binarized data. The conventional adaptive threshold value generating circuit 11 generates a threshold value optimized for binarization purposes with respect to the background brightness.

With the binary coding circuit of this embodiment, the threshold value optimized for binarization purposes in accordance with the background brightness generated by the adaptive threshold value generating circuit 11, and the signal output via the high-pass filter 2 and the limiter or other such non-linear circuit 3 that serves to limit the amplitude of the signal, are added by the adder 10. The binarization comparator 12 then compares the signal output by the adder 10 with the input signal and binarizes the input signal accordingly. As a result, at noise portions there is no intersection of threshold values and noise components, so the noise does not get binarized. Also, characters or fine image components that have a large amplitude, or which have a small amplitude but are thick, are determined as being characters and are therefore retained, which by thus minimizing the amount of information that is lost results in clear binarized images.

FIG. 3 is a set of waveforms depicting time-based changes in signal amplitudes and time in the case of the first embodiment. FIG. 3 (a) shows input signal A and conventional adaptive threshold value B. The high-frequency low-level-component signal C of FIG. 3 (b) output by the high-pass filter 2 is added to the adaptively-processed conventional adaptive threshold value B to obtain an adder output D, The adder output D and input signal A are compared and binarized by the binarization comparator 12 to obtain a binarized output E. Accordingly, therefore, at noise portions there is no intersection of threshold values and noise components, so the noise does not get binarized. Also, image components that are fine but have a large amplitude, or those which have a small amplitude but are thick, are determined as being characters and are therefore retained, minimizing the information loss.

Figure 2:
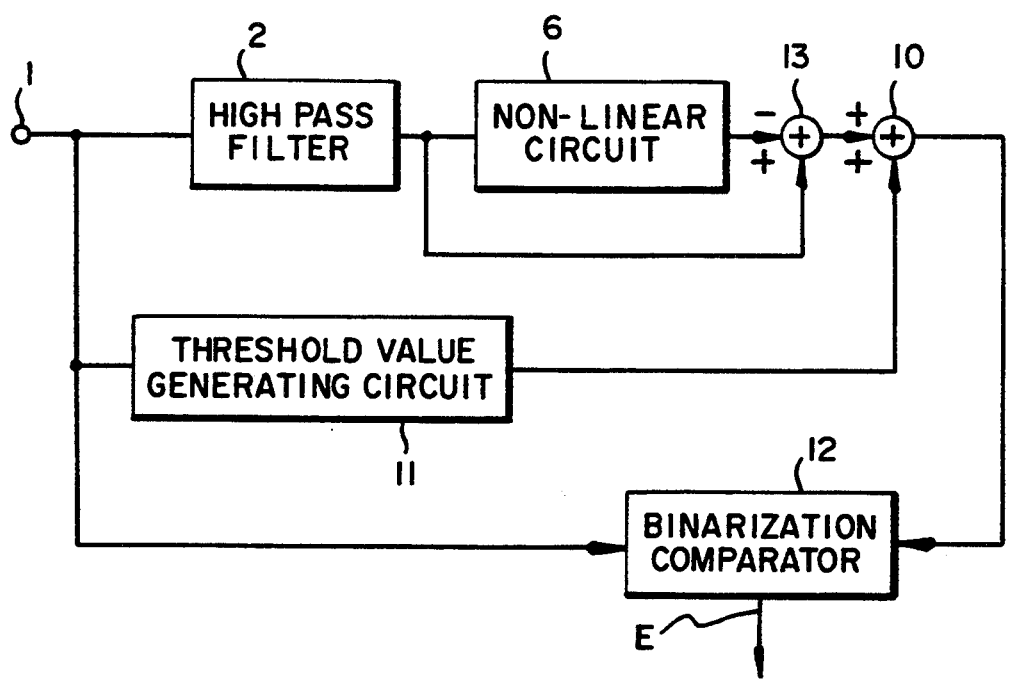
FIG. 2 is a block diagram of the binary coding circuit according to a second embodiment of the invention.
Figure 3A:
FIG. 3a-3d is a set of waveforms depicting time-based changes in signal amplitudes at each point, in the case of the first embodiment.
Figure 3B:
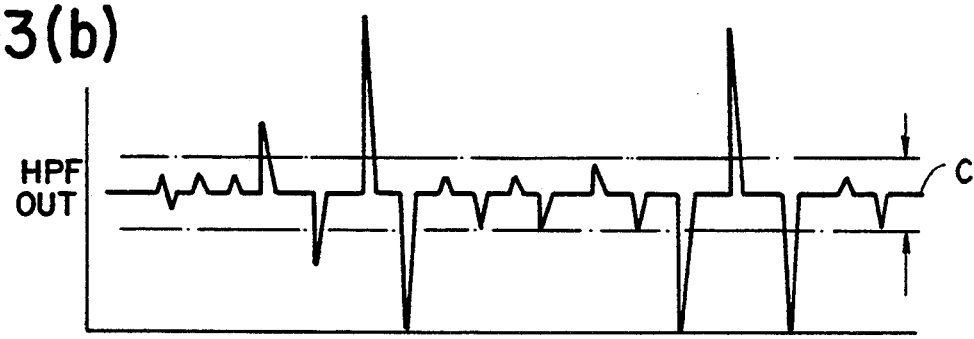
Figure 3C:
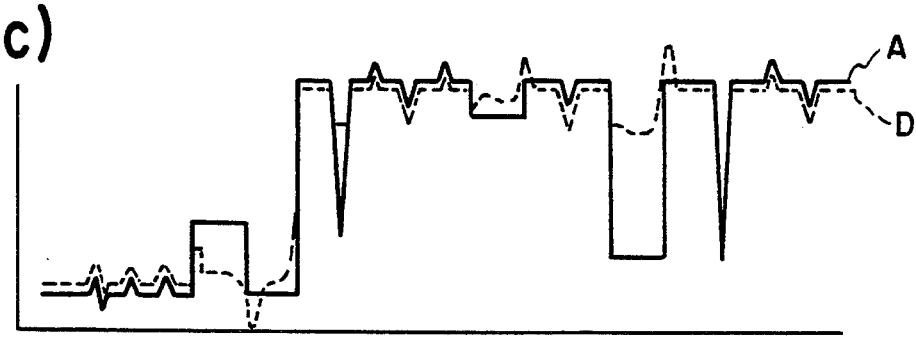
Figure 3D:
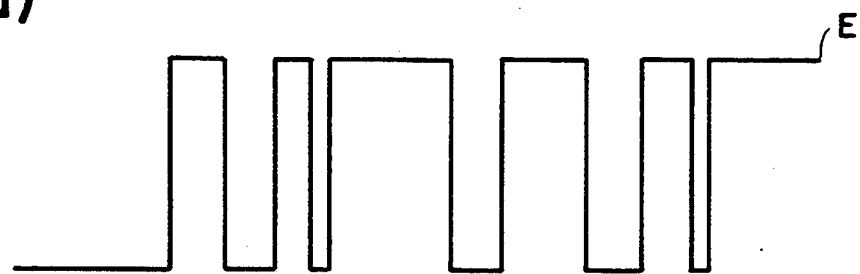

FIG. 2 is a block diagram of a second embodiment of the invention. Where this embodiment differs from the arrangement of the first embodiment is that while the signal input via the input terminal 1 is divided into two signals, instead of one of these signals being passed through a high-pass filter 2 and a limiter or other such non-linear circuit 3, it is passed through an expander or other such non-linear circuit 6 and is then input to a differential circuit 13, limiting the high-frequency amplitude, the difference between the output of the high-pass filter 2 and the signal that has been directly input is obtained by subtracting the directly-input signal from the high-pass filter 2 output, and the resultant signal is input to the adder 10. Other than these points the arrangement is the same as that shown in FIG. 1, and the action and effect also are the same.

The invention has been described in detail with particular reference to certain preferred embodiments thereof, but it will be understood that variations and modifications can be effected within the spirit and scope of the invention.

What is claimed is;

1. A binary coding circuit that eliminates input signal components that have high frequencies and a small amplitude, comprising:

an adaptive threshold value generating circuit for generating optimum threshold values for binarization of background components;

a high-pass filter circuit that outputs high-frequency components of the input signal;

an adder that adds the outputs of the adaptive and high-pass filter circuits; and binarization means for binarizing the input signal in response to a comparison of the output of the adder and the input signal.

* * * * *